United States Patent [19]
Hsue

[11] Patent Number: 5,455,444
[45] Date of Patent: Oct. 3, 1995

[54] DOUBLE POLYSILICON ELECTROSTATIC DISCHARGE PROTECTION DEVICE FOR SRAM AND DRAM MEMORY DEVICES

[75] Inventor: Chen-Chiu Hsue, Hsin-chu, Taiwan

[73] Assignee: United Microelectronics Corporation, Hsinchu, Taiwan, Prov. of China

[21] Appl. No.: 231,515

[22] Filed: Apr. 22, 1994

[51] Int. Cl.[6] .......................... H01L 29/04; H01L 21/265
[52] U.S. Cl. ............... 257/413; 257/336; 257/337; 257/408; 437/49; 437/56; 437/233
[58] Field of Search ........................ 257/413, 336, 257/337, 408; 437/49, 56, 233

[56] References Cited

U.S. PATENT DOCUMENTS

| | | | |
|---|---|---|---|
| 4,804,636 | 2/1989 | Groover et al. | 257/413 |
| 4,937,639 | 6/1990 | Yao et al. | 357/23.13 |
| 4,952,994 | 8/1990 | Lin | 357/23.13 |
| 5,019,883 | 5/1991 | Mori et al. | 357/23.13 |
| 5,027,185 | 6/1991 | Liauh et al. | 257/413 |
| 5,027,252 | 6/1991 | Yamamura | 361/58 |
| 5,142,345 | 8/1992 | Miyata | 357/23.13 |
| 5,225,702 | 7/1993 | Chatterjee | 257/360 |
| 5,229,635 | 7/1993 | Bessolo et al. | 257/360 |
| 5,256,892 | 10/1993 | Yoshida | 257/413 |

Primary Examiner—Edward Wojciechowicz
Attorney, Agent, or Firm—George O. Saile; Graham S. Jones, II

[57] ABSTRACT

A semiconductor ESD device on a substrate is covered with $SiO_2$ and FOX regions, made by forming a blanket first gate layer on the device including the $SiO_2$ and FOX regions, patterning the first gate layer into an ESD device and a gate in a standard device area separated by a FOX region, forming LDD implantation in the substrate adjacent to the gate in the standard device area, forming spacers adjacent to the periphery of the first gate layer and the gate, ion implanting dopant near the spacers to form source/drain regions adjacent to the standard device, forming an interpolysilicon dielectric layer over the device, forming a polysilicon via mask for the ESD device and etching the interpolysilicon dielectric layer to form a via opening through the mask, deposition of a second gate layer shorted to the first gate layer in the ESD device area and forming a masking layer and etching away exposed areas of the second gate layer and the first gate layer leaving a stacked structure from portions of the first gate and the second gate upon the ESD device, removal of the masking layer, and forming a mask and performing a doping process doping the second gate structure and second source/drain regions in the substrate in the ESD area.

13 Claims, 6 Drawing Sheets

DOUBLE POLYSILICON ELECTROSTATIC DISCHARGE PROTECTION DEVICE FOR SRAM AND DRAM MEMORY DEVICES

BACKGROUND OF THE INVENTION

1. Field of the Invention

This invention relates to semiconductor memory devices and more particularly to electrostatic discharge protection devices therefor.

2. Description of Related Art

For Lightly Doped Drain (LDD) technology Input/Output Electrostatic Discharge (ESD) protection suffers from the LDD structures. While the conventional Source/Drain structure has the advantage of providing improved ESD protection, it has the disadvantage that to achieve that advantage, the burden of providing one extra masking step is required to secure the desired protection. The disadvantages of increased cost and increased cycle time are significant. The conventional Source/Drain structure requires that extra masking step burdening the manufacturer with increased process cycle time and the resultant increased processing costs.

U.S. Pat. No. 5,142,345 of Miyata for "Structure of Input Protection Transistor in Semiconductor Device Including Memory Transistor Having Double-Layered Gate and Method of Manufacturing Semiconductor Device Including Such Input Protecting Transistor" uses an EPROM device as an input protection device. Referring to FIGS. 5 and 6 of Miyata, an input protection transistor 180 is provided. The gate is composed of a laminated polysilicon 1/dielectric/polysilicon 2 (212/214/216) structure and the ESD N+ S/D formation (source/drain regions 206a and 206b) formed before the normal LDD device as explained in detail in FIG. 9A–9K of Miyata et al. The input protection transistor is formed in region 36 in FIGS. 9A–9E. The LDD device is formed in region 35 is formed starting with FIG. 9E.

Additionally, U.S. Pat. Nos. 4,937,639 of Yao et al, 4,952,994 of Lin, 5,027,252 of Yamamura, 5,225,702 of Chatterjee, and 5,229,635 show ESD protection devices and methods of making devices.

SUMMARY OF THE INVENTION

An object of this invention is to reduce the cost and cycle time in the process of manufacture of SRAM and DRAM devices, while providing excellent ESD protection.

In accordance with this invention, a semiconductor electrostatic discharge device adapted for inclusion in a semiconductor memory system, formed on a semiconductor substrate covered with silicon dioxide and field oxide regions, is manufactured by the process comprising formation of a blanket first gate layer on the surface of the device including the silicon dioxide and field oxide regions, patterning the first gate layer into an electrostatic discharge device and a gate in a standard device area separated by a field oxide region, formation of lightly doped drain implantation into the substrate adjacent to the gate in the standard device area, formation of spacers adjacent to the periphery of the first gate layer and the gate, ion implanting dopant adjacent to the spacers to form source/drain regions adjacent to the standard device, formation of an interpolysilicon dielectric layer over the device, formation of a polysilicon via mask for the electrostatic discharge device and etching the interpolysilicon dielectric layer to form a via opening through the mask, deposition of a second gate layer shorted to the first gate layer in the electrostatic discharge device area and forming a masking layer and etching away exposed areas of the second gate layer and the first gate layer leaving a stacked structure from portions of the first gate and the second gate upon the electrostatic discharge device, removal of the masking layer, and formation of a mask and performing a doping process for doping the second gate layer and second source/drain regions in the substrate in the electrostatic discharge area.

Preferably, the second gate structure is directly short circuited to the first gate layer of the electrostatic device area of the device; the first layer comprises a material selected from polysilicon and a polycide selected from the group consisting of $WSi_2$, $TiSi_2$, $CoSi_2$, and $MoSi_2$; the second layer comprises a material selected from polysilicon and a polycide selected from the group consisting of $WSi_2$, $TiSi_2$, $CoSi_2$, $MoSi_2$, and $TaSi_2$; and a doping process for doping the second layer produces a doping of about $2E15$ $cm^{-2}$; the interpolysilicon region over the standard device area has a thickness of about 2,000 Å; and the second source/drain regions in the substrate in the electrostatic discharge area are doped to about $2E15$ $cm^{-2}$.

In accordance with another aspect of this invention, a semiconductor electrostatic discharge device is adapted for inclusion in a semiconductor memory system, formed on a semiconductor substrate covered with silicon dioxide and field oxide regions, comprising a first layer composed of a material selected from polysilicon and polycide having a surface, the surface of the device including thereon silicon dioxide and field oxide regions, the first layer having been patterned into an electrostatic discharge device and a gate in a standard device area separated by a field oxide region, lightly doped drain implantation regions in the substrate adjacent to the gate in the standard device area, spacers adjacent to the periphery of the first layer and the gate, dopant adjacent to the spacers forming source/drain regions adjacent to the standard device, an interpolysilicon region over the standard device area, a second layer composed of a material selected from polysilicon and polycide formed upon the electrostatic discharge device area and the second layer stacked upon the first layer in the electrostatic discharge device, and the second layer and second source/drain regions in the substrate in the electrostatic discharge area being doped.

Preferably, the second gate structure is directly short circuited to the first gate layer of the electrostatic device area of the device; the second layer is doped about $2E15$ $cm^{-2}$; the interpolysilicon region over the standard device area has a thickness of about 2,000 Å; the second source/drain regions in the substrate in the electrostatic discharge area are doped to about $2E15$ $cm^{-2}$.

BRIEF DESCRIPTION OF THE DRAWINGS

The foregoing and other aspects and advantages of this invention are explained and described below with reference to the accompanying drawings, in which:

FIG. 5F shows the product of FIG. 5C which is a section taken along line 3—3 in FIG. 2 which has been subjected to steps of deposition, masking and etching of polysilicon 2 layer.

DESCRIPTION OF THE PREFERRED EMBODIMENT

In accordance with this invention, the ESD protection masking step is merged with the standard process of manufacture of a polysilicon load SRAM while saving cycle time and costs. The same method can be employed for manufacture of DRAM devices.

Figure 1:
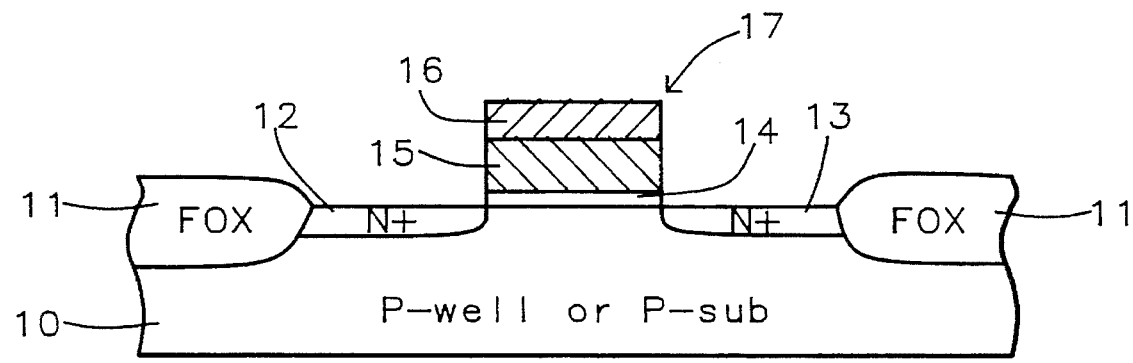
FIG. 1 shows a device in accordance with this invention with a P-well or P-sub silicon semiconductor substrate, a gate oxide layer and FOX structures formed on the surface thereof, with a gate of polysilicon 1 layer 15 and a polysilicon 2 layer formed on the gate oxide layer.

In the embodiment of this invention shown in FIG. 1, a P-well or P-sub silicon semiconductor substrate 10 has a gate oxide layer 14 and field oxide (FOX) structures 11 formed on the surface thereof, with a gate 17 of polysilicon 1 gate layer 15 and a polysilicon 2 gate layer 16 formed on gate oxide layer 14. Between the gate and the FOX structures 11 are the source and drain regions 12 and 13.

The polysilicon 2 layer 16 is directly short circuited to the polysilicon 1 layer 15 (whether polysilicon or polycide) and only the N+ source/drain doping of regions 12 and 13 for ESD protection of the device. There can be more than one polysilicon gate within an active region, as shown in FIG. 2.

Figure 2:
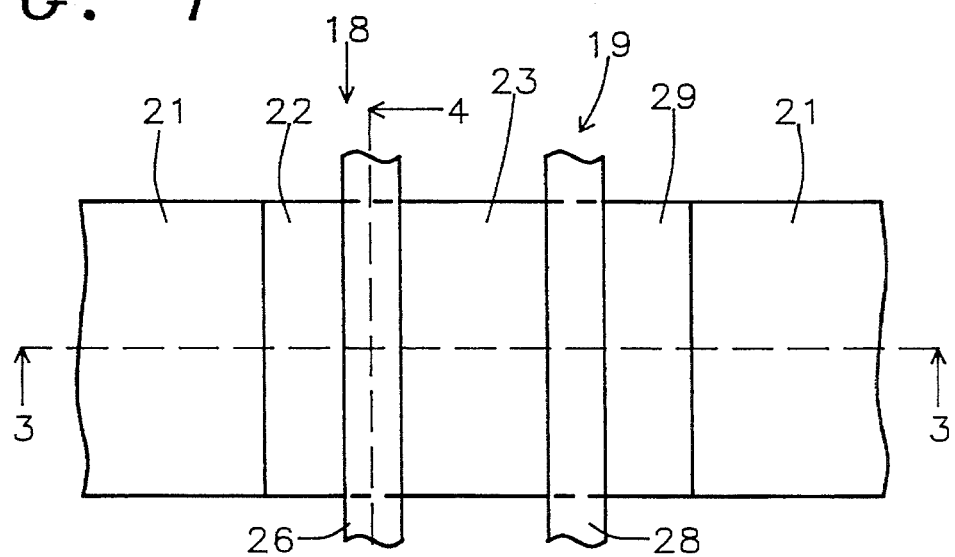
FIG. 2 shows an ESD MOSFET device layout in accordance with this invention.

FIG. 2 shows an ESD MOSFET device layout in accordance with this invention.

Figure 3:
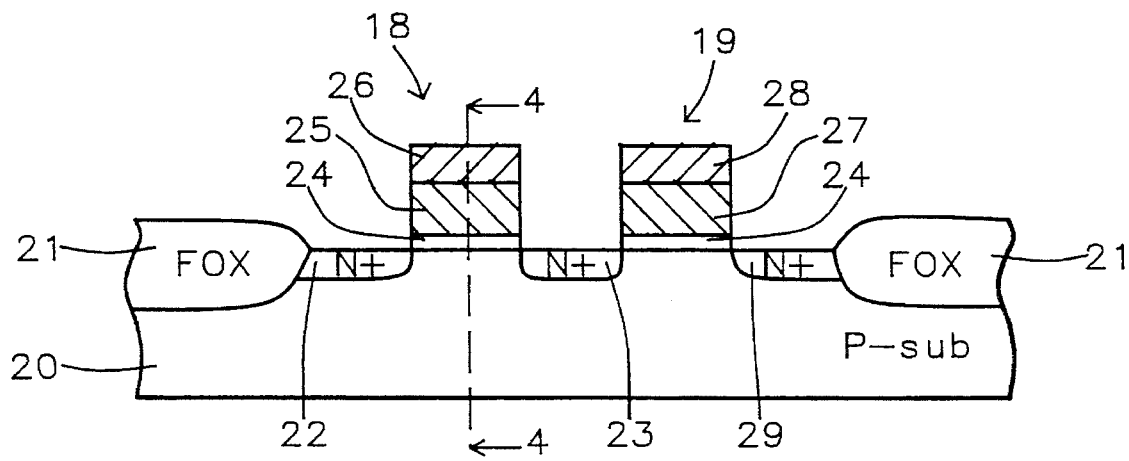
FIG. 3 is a sectional view taken along line 3—3 in FIG. 2.

FIG. 3 is a sectional view taken along line 3—3 in FIG. 2 which shows two stacked-layer, polysilicon gates 18 (gate layers 25/26) and 19 (gate layers 27/28) within an active P-sub region 20 upon which field oxide (FOX) regions 21 are formed. Between FOX regions 21 in the surface of P-sub region 20 are N+ regions 22, 23 and 29 which comprise arsenic (As+) dopant or $P^{31}$ dopant with a dose of from about $10^{15}$ cm$^{-2}$ to about $10^{15}$ cm$^{-2}$.

Figure 4:
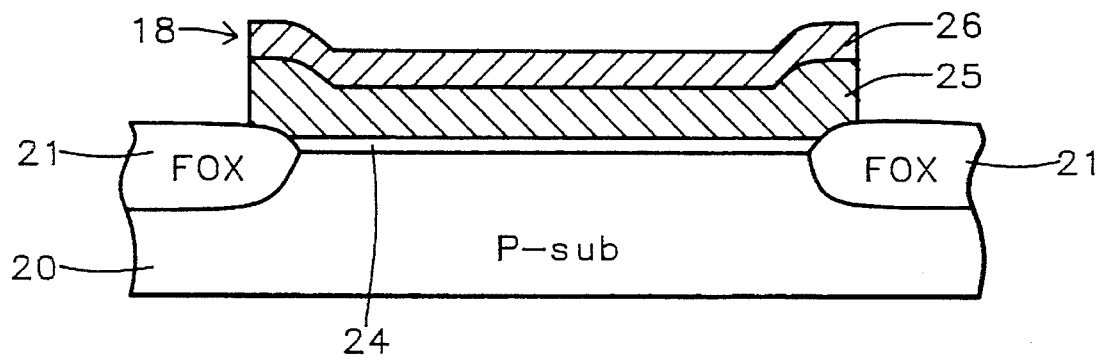
FIG. 4 is a sectional view taken along line 4—4 in FIG. 2.

FIG. 4 is a sectional view taken along line 4—4 in FIG. 2 which shows the stacked layer polysilicon gate 18 comprising polysilicon 1 gate layer 25 and polysilicon 2 gate layer 26 deposited thereon over active region 20 and overlapping FOX region 21 at the ends, unlike FIG. 3. The upper layer of the gate is polysilicon 2 layer 26 which is of the same cross sectional size (in the horizontal x, y plane) as layer 25.

PROCESS STEPS

FIGS. 5A–5H show sectional views of the device similar to the device of FIG. 2 taken along a line similar to section line 3—3 with the exception that FIGS. 5A–5H show only one device instead of two devices, illustrating an embodiment of a device being formed in accordance with the process of this invention. The P-substrate 20 includes the N+ regions 22, 23 and 29.

After the process of polysilicon 1 definition, whole ESD devices are covered by polysilicon 1 layer as shown in layout.

Figure 5A:
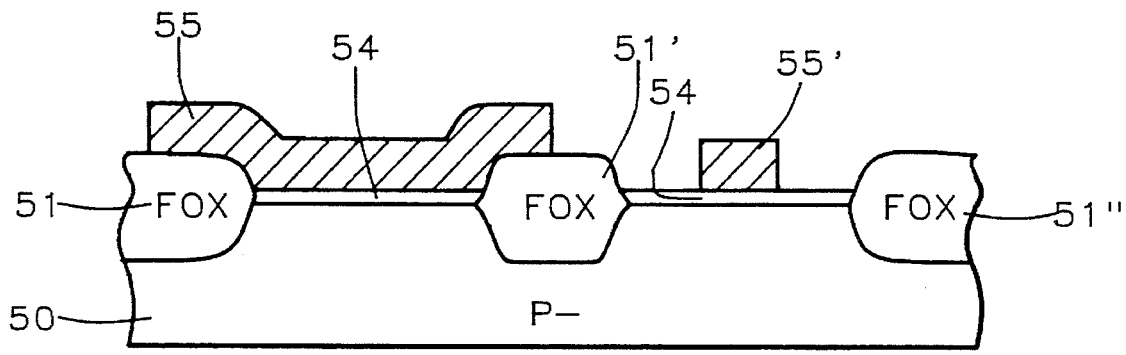
FIG. 5A shows a sectional view of a device in accordance with this invention (taken along a similar section to line 3—3 in FIG. 2. with the exception that FIGS. 5A–5H show only one device instead of two devices.)

FIG. 5A shows a sectional view of a device in accordance with this invention (taken along a similar section to line 3–3 in FIG. 2.) However, only one device instead of two devices are shown in FIGS. 5A–5H.

The device includes P-well or P-substrate 50 with FOX regions 51, 51' and 51" and a gate oxide layer 54 between FOX regions 51, 51' and 51". A polysilicon 1 gate element 55 for an ESD device is formed on gate oxide layer 54 between FOX regions 51 and 51' and overlies portions of FOX regions 51 and 51'. The additional polysilicon 1 gate element 55' for a standard device is formed on gate oxide layer 54 between FOX regions 51' and 51".

Figure 5B:
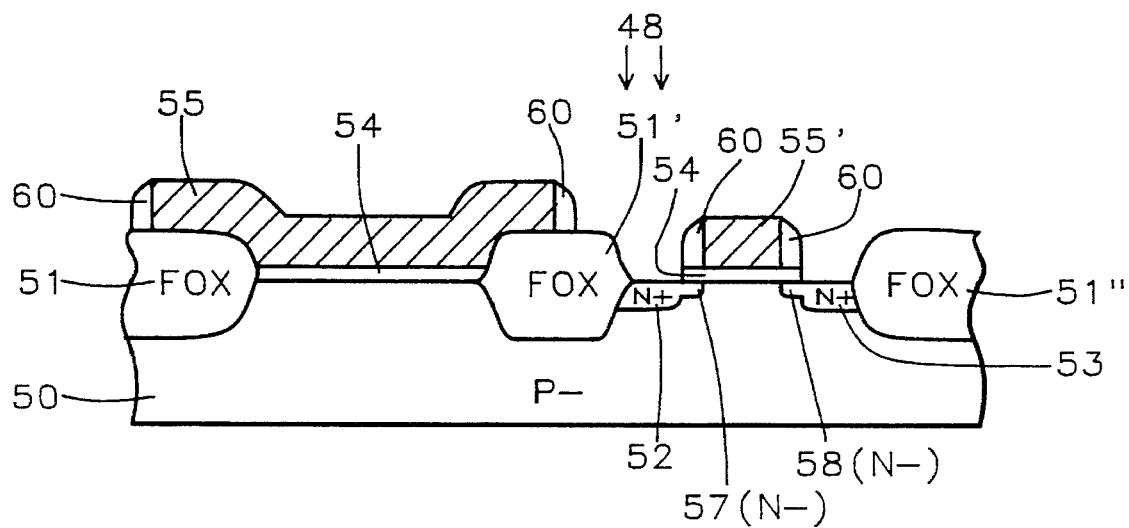
FIG. 5B shows the product of FIG. 5A which has been subjected to N– LDD ion implantation into what become the new N– regions on either side of an "additional" polysilicon 1 gate.

FIG. 5B shows the product of FIG. 5A which has been subjected to N– LDD ion implantation into what become the new N– regions 57 and 58 on either side of the additional polysilicon 1 gate 55' by a process of $P^{31+}$ ion implantation dosage within the range from about 5E12 cm$^{-2}$ to about 5E13 cm$^{-2}$.

The N– dopant ions are applied at a preferred dose of about $2\times10^{13}$ cm$^{-2}$ of $P^{31}$ at a preferred energy of about 60 keV. A range of energies from approximately 30 keV to approximately 90 keV is possible. A range of doses from approximately $5\times10^{12}$ cm$^{-2}$ to approximately $5\times10^{13}$ cm$^{-2}$ is possible.

Next, silicon dioxide spacer structures 60 were formed by means of CVD oxide deposition and then a blanket etch back process leaving spacer structures 60 at either end of of gate elements 55 and 55'.

Then N+ source/drain regions 52/53 are formed between the FOX regions 51/51+ and the additional polysilicon 1 gate 55'. The N+ dopant As (arsenic) ions 48 are implanted through openings in an N+ source/drain (S/D) mask into regions 52 and 53. The N+ dopant ions 48 are applied at a preferred dose of $5\times10^{15}$ cm$^{-2}$ of As$^+$ at a preferred energy of 80 keV to provide a far higher level of doping than in the remainder of the N– regions 57, 58. A range of energies from approximately 40 keV to approximately 120 keV is possible. A range of doses from approximately $1\times10^{15}$ cm$^{-2}$ to approximately $8\times10^{15}$ cm$^{-2}$ is possible.

Figure 5C:
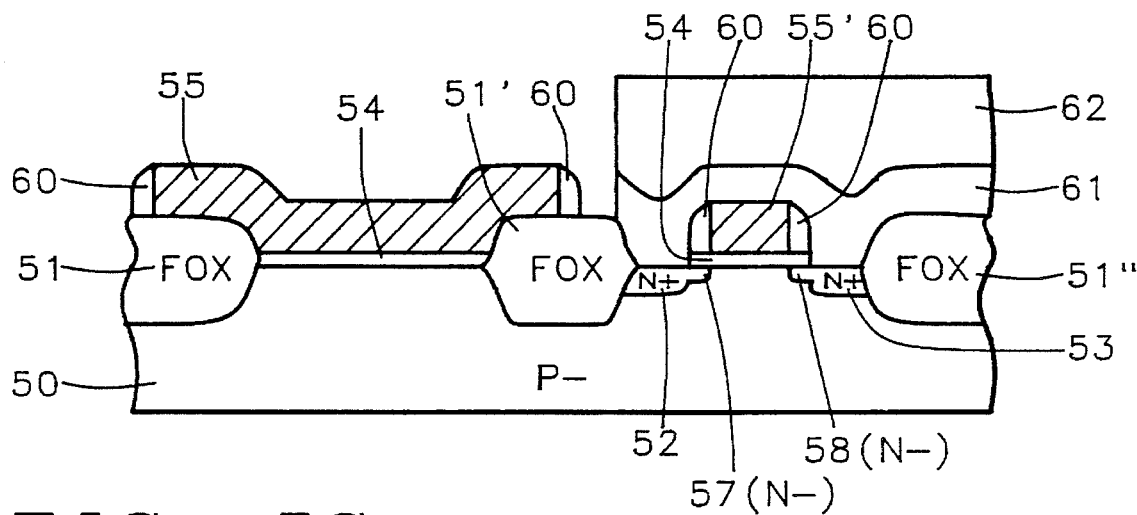
FIG. 5C shows the product of FIG. 5B which has been subjected to the steps of deposition of inter-polysilicon silicon dioxide layer, then forming a polysilicon VIA mask, and subsequently etching of the interpolysilicon layer.

FIG. 5C shows the product of FIG. 5B which has been subjected to the steps of deposition of inter-polysilicon silicon dioxide layer 61, then forming a polysilicon VIA mask 62, and subsequently etching of the interpolysilicon layer 61.

First, an inter-polysilicon-oxide deposition of layer 61 composed preferably of silicon dioxide is performed by CVD (chemical vapor deposition) to a thickness of approximately 2000 Å.

Subsequently a polysilicon VIA mask 62 is formed of photoresist by photolithography.

Subsequently the exposed area interpolysilicon layer 61 is etched by means of etching in a plasma oxide etching chamber using an etching process selected from an Applied Materials 8310 oxide unit and etcher.

Figure 5D:
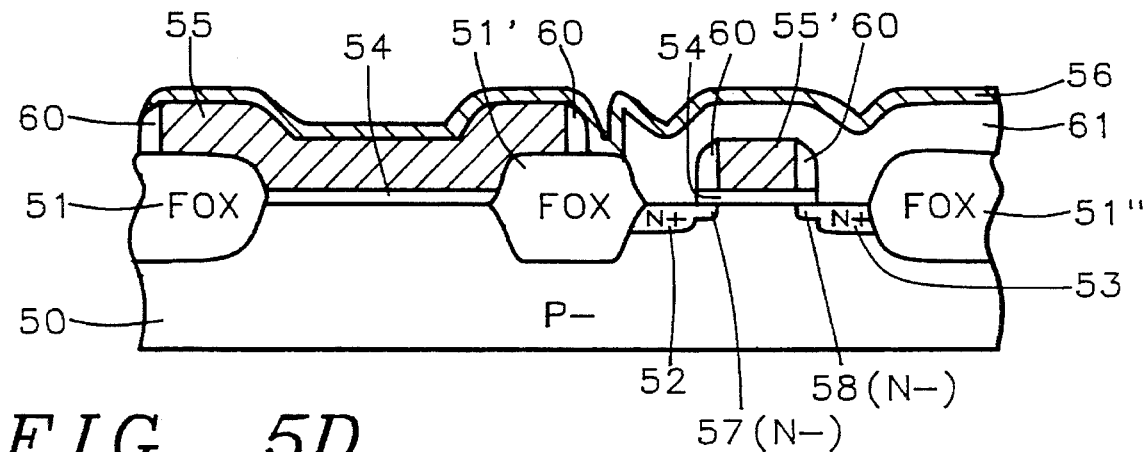
FIG. 5D shows the product of FIG. 5C after the interpolysilicon layer has been etched away and the mask has been removed, and a blanket polysilicon 2 layer has been formed over the entire surface of the device.

Referring to FIG. 5D, the product of FIG. 5C is shown after the interpolysilicon layer 61 has been etched away and the mask 62 has been removed, and a blanket polysilicon 2 layer 56 has been formed over the entire surface of the device.

The deposition of polysilicon 2 layer 56 is performed by a blanket deposition using the process of LPCVD with $SiH_4$ at 600° C. with a range of parameters of temperatures from 550° C. to about 620° C. is possible.

Then masking of polysilicon 2 layer 56 is performed by blanket depositing photoresist upon the layer 56 followed by photolithographic formation of a mask 64.

Then etching of polysilicon 2 layer 56 using mask 64 is performed using the process of a plasma polysilicon etcher to etch away the exposed areas of layer 56 with the range of parameters of SF6 gas.

Figure 5E:
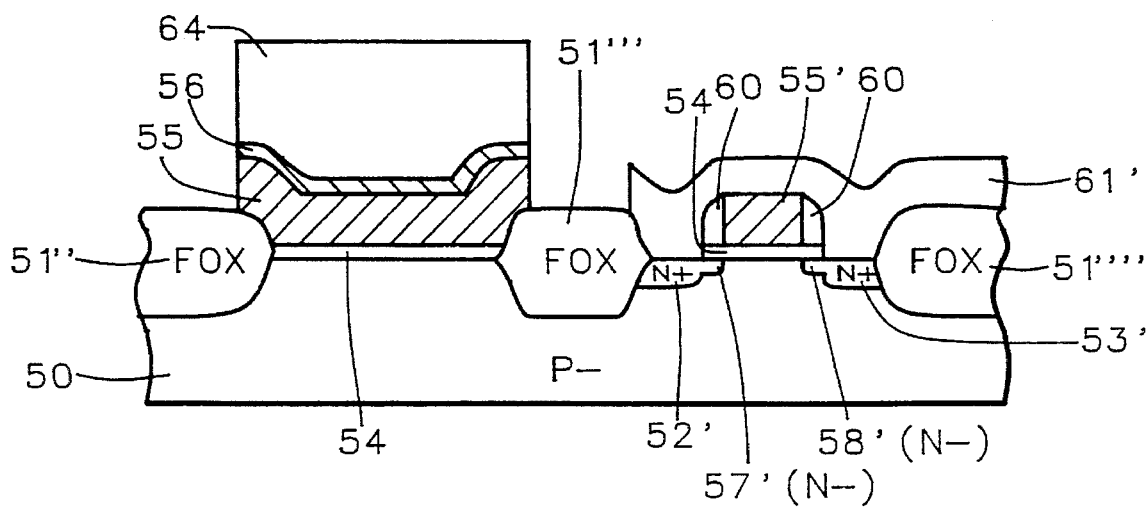
FIG. 5E shows the product of FIG. 5D which is a section taken along a line analogous to line 4—4 in FIG. 2 in the device of FIG. 5D
Figure 5F:
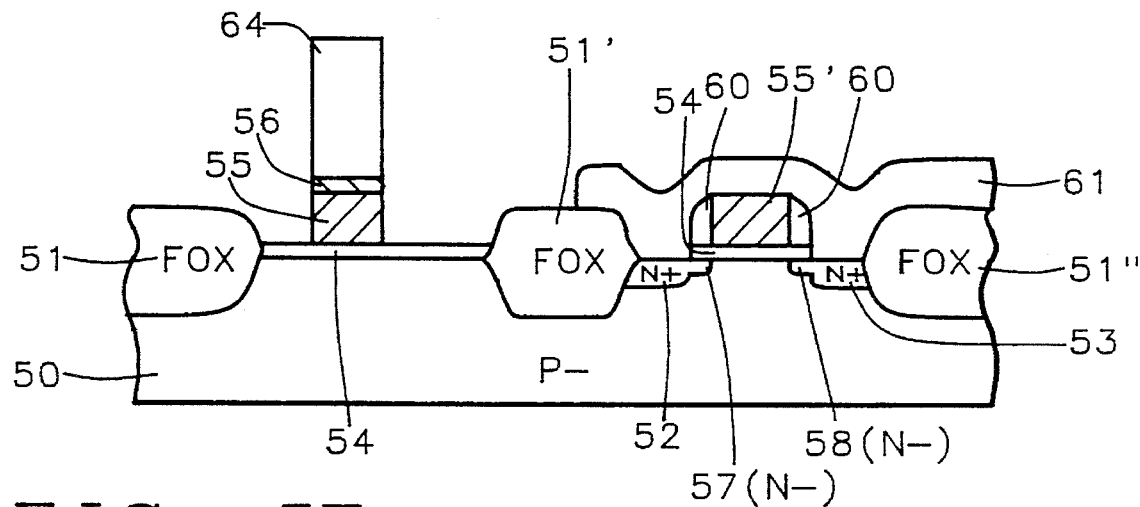
FIG. 5F shows the product of FIG. 5D which is a section taken along line 3—3 in FIG. 2.

FIG. 5E shows the product of FIG. 5D which is a section taken along a line analogous to line 4—4 in FIG. 2 in the device of FIG. 5D and FIG. 5F shows the product of FIG. 5D which is a section taken along line 3—3 in FIG. 2. FIGS. 5E and 5F show the device of FIG. 5D after the photoresist layer 64 has been blanket deposited, patterned by photolithography, developed and formed into the mask 64 shown.

In FIG. 5E, N+ source/drain regions 52'/53' are shown between the FOX regions 51''' and 51'''' and the additional polysilicon 1 gate 55''. The lnter-polysilicon silicon dioxide layer 61' is also shown above the floating gate 55'.

FIG. 5F shows the product of FIG. 5C which is a section taken along line 3—3 in FIG. 2 which has been subjected to steps of deposition, masking and etching of polysilicon 2 layer 56.

Figure 5G:
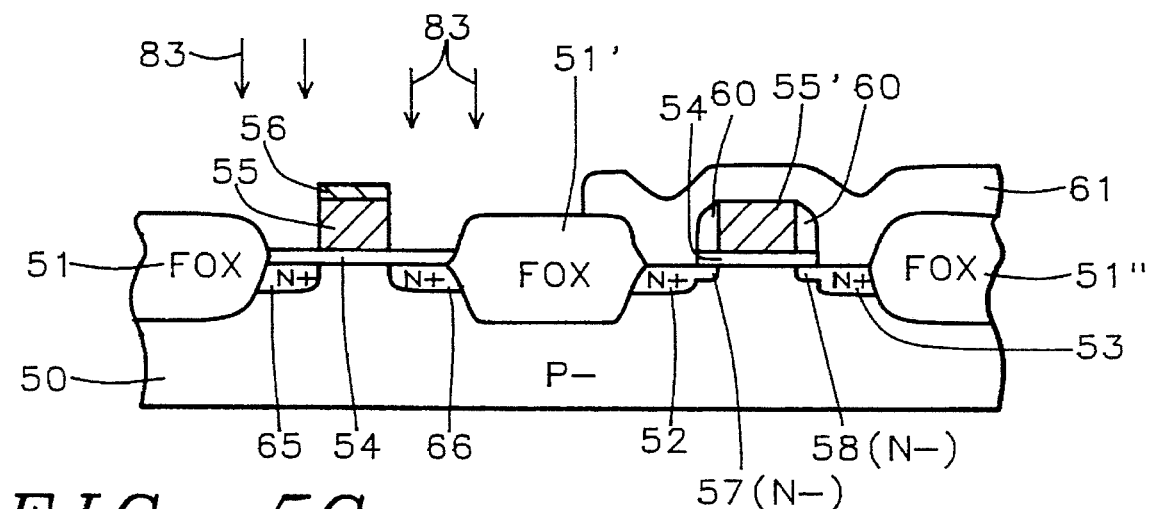
FIG. 5G shows the product of FIG. 5F which has been subjected to steps of removal of photoresist, polysilicon 2 gate implant masking and polysilicon 2 gate N+ ion implantation with ions.

FIG. 5G shows the product of FIG. 5F which has been subjected to steps of removal of photoresist 64, polysilicon 2 gate 56 implant masking and polysilicon 2 gate 56 N+ ion implantation with ions 83.

The photoresist mask 64 is removed with $H_2SO_4/H_2O_2$, 80° C., plasma $O_2$ strip.

The polysilicon 2 layer 56 implant masking step is used to mask some required for high resistance polysilicon 2 including the SRAM polysilicon load area (not shown for convenience of illustration.)

Next, polysilicon 2 layer 56 N+ implantation As dopant N+ ions 83 are implanted through the opening and into source/drain regions 65/66. The As N+ dopant ions 83 are applied at a preferred dose of approximately $10^{15}$ cm$^{-2}$ at a preferred energy of 80 keV to provide a far higher level of doping than in the remainder of the P- substrate 50. A range of energies from approximately 40 keV to approximately 120 keV is possible. A range of doses from approximately $1\times10^{15}$ cm$^{-2}$ to approximately $5\times10^{15}$ cm$^{-2}$ is possible.

Figure 5H:
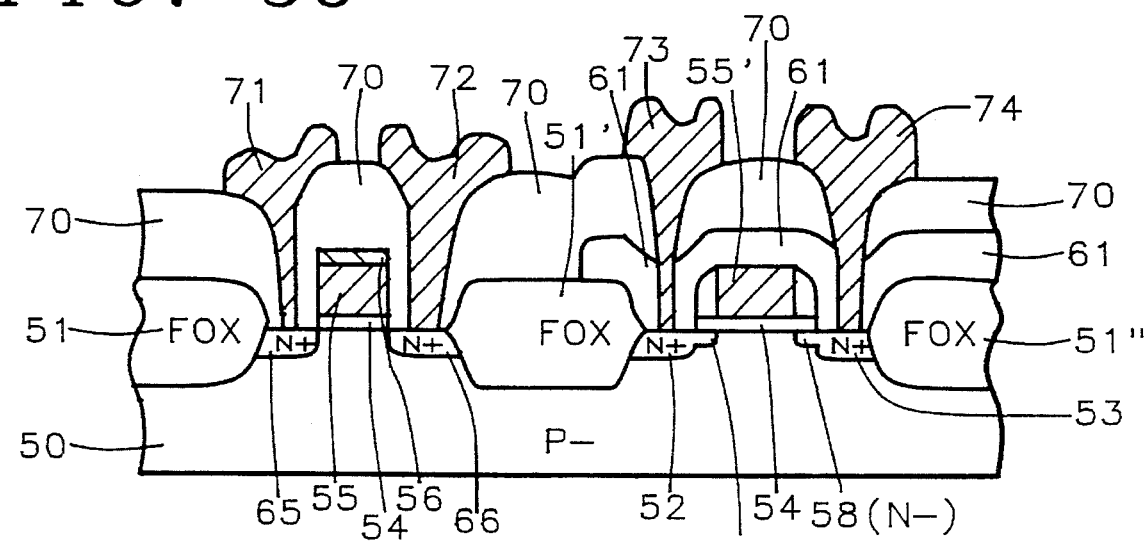
FIG. 5H shows the product of FIG. 5G which has been subjected to steps of BPSG deposition, contact opening and metallization sputtering and etching.

FIG. 5H shows the product of FIG. 5G which has been subjected to steps of BPSG deposition, contact opening and metallization sputtering and etching. Layer 70 is composed of BPSG deposited by APCVD (Atmospheric Pressure CVD) with $SiH_4/O_2/PH_3/B_2H_6$.

Contact to N+ S/D regions 65/66/52/53 is provided by opening down to the S/D regions 65/66/52/53, and in part through inter-polysilicon-oxide deposition of layer 61 and depositing metal element 71, metal element 72, metal element 73, metal element 74 into those openings by metal sputtering.

Figure 6A:
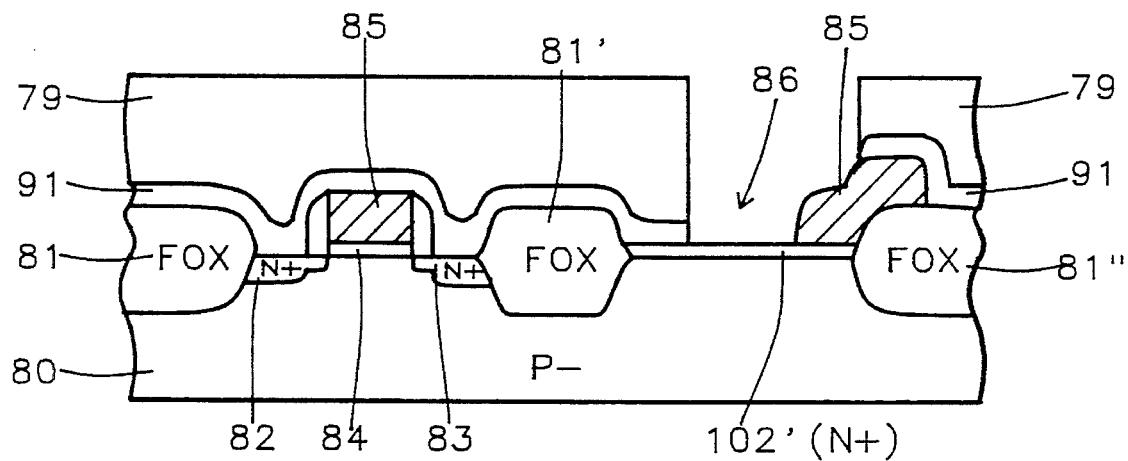
FIGS. 6A–6D show sectional view of another device in accordance with this invention including a P-well or P-sub silicon semiconductor substrate with a gate oxide layer and FOX structures formed on the surface thereof.
Figure 6B:
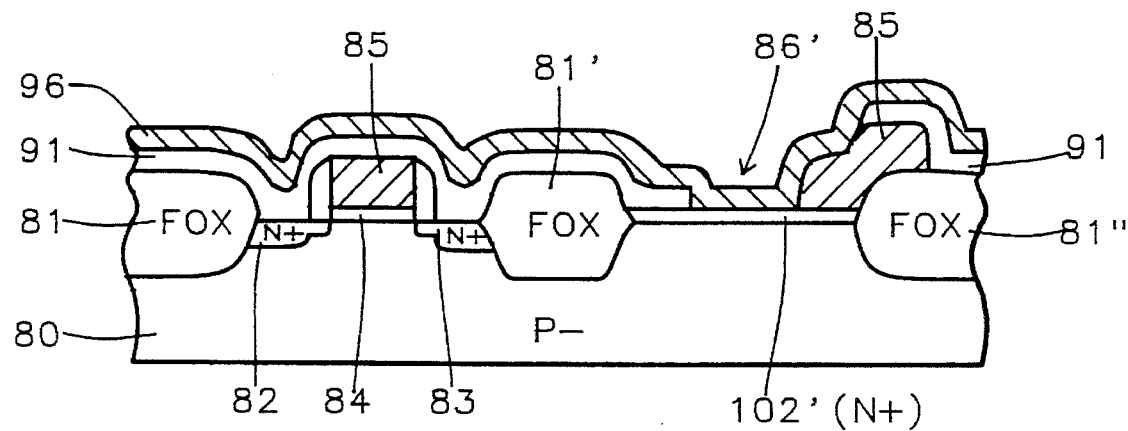
Figure 6C:
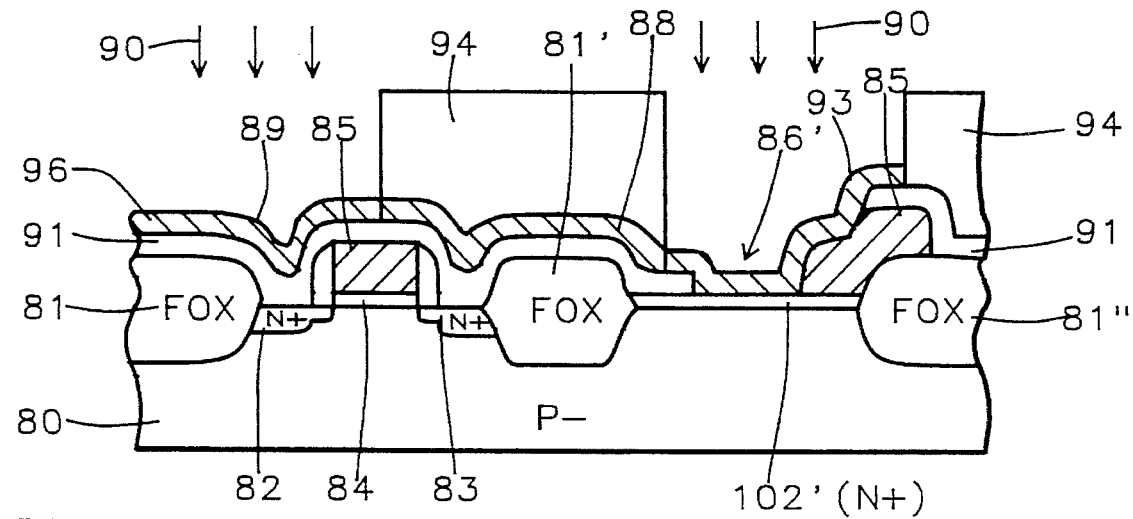

In the embodiment of this invention shown in FIGS. 6A–6C, a P-well or P-sub silicon semiconductor substrate 80 has a gate oxide layer 84 and FOX structures 81 formed on the surface thereof. A polysilicon 1 gate layer 85 (whether polysilicon or polycide) is formed over gate oxide layer 84. N+ source/drain doping of regions 82 and 83 include N– and N+ adjacent to either end of gate oxide layer 84 are standard LDD devices.

In FIG. 6A VIA opening 86 in interpolysilicon layer 91 is formed by etching through mask 79.

In FIG. 6B, VIA 86' is formed in opening 86 as a polysilicon 2 gate layer 96 has been deposited upon the product of FIG. 6A into contact connecting mechanically and electrically forming a VIA with active N+ region 102' and short circuiting gate layer 96 with polysilicon 1 gate layer 85.

In FIG. 6C, a mask 94 has been formed exposing regions of the polysilicon 2 gate layer 96 to ion implantation of ions 90 forming low resistance sections 89 and 93 and leaving the masked portion of polysilicon 2 layer 96 as a high resistance region 88. Thus, the polysilicon 2 layer 96 is divided into three sections 89 and 93 which are low resistance sections with high resistance section 88 between sections 89 and 93.

Figure 6D:
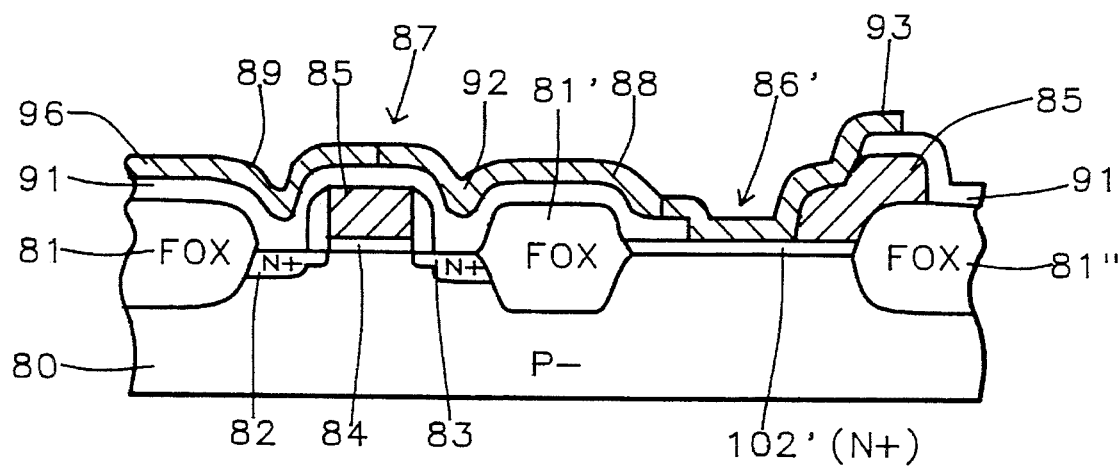

Referring to FIG. 6D, which is the product of FIG. 6C, with the mask 94 removed, a conventional polysilicon load SRAM device processed in accordance with FIG. 5A–5H is an ESD device in accordance with this invention. The interpolysilicon layer 91 in FIG. 6A–6D is equivalent to layer 61, 61' in FIGS. 5C–5H; polysilicon 2 layer 96 is analogous to layer 56, via opening 86 is analogous to the opening provided by resist 62 in FIG. 5C. Polysilicon 2 doping ions 90 are applied to sections 89 and 93 equivalent to ion implantation 83 in FIG. 5G (for polysilicon 2 layer 56 and N+S/D 65, 66 doping); polysilicon 2 masking area 96 equivalent to mask 64 in FIGS. 5E and 5F. Accordingly, the ESD device in accordance with this invention can be formed automatically by a conventional SRAM process without the extra mask for the ESD device.

Figure 7:
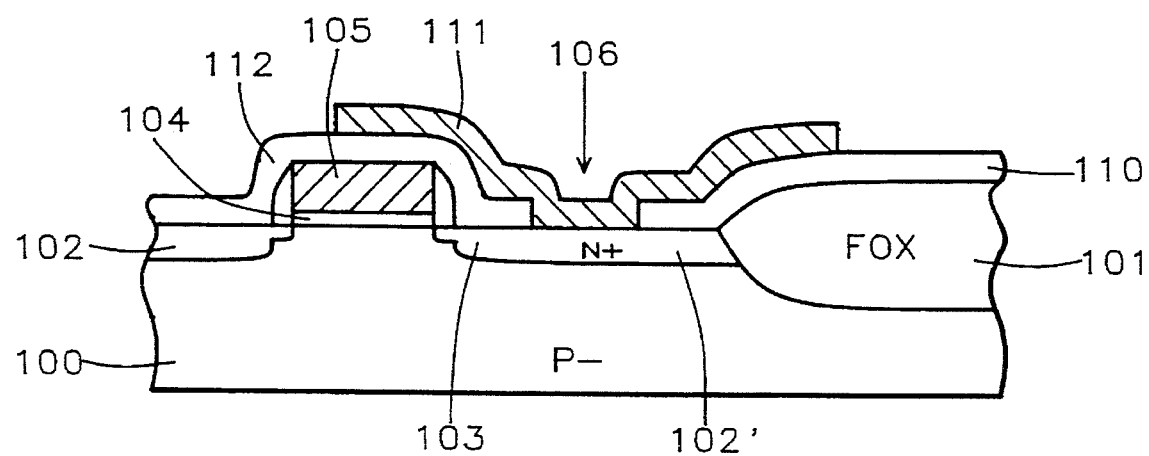
FIG. 7 shows a sectional view of another device in accordance with this invention with a P-well or P-sub (silicon semiconductor substrate) having a gate oxide layer and FOX structures formed on the surface thereof.

In the embodiment of this invention shown in FIG. 7, a P-well or P-sub (silicon semiconductor substrate) 100 has a gate oxide layer 104 and FOX structures 101 formed on the surface thereof. A polysilicon 1 gate layer 105 (whether polysilicon or polycide) and N+ source/drain doping of regions 102 and 103 are N– and N+ structures from a standard device. Via 106 (like Via 86') is formed in an opening in ONO layer 110 from polysilicon 2 layer 111 connected directly to N+ junction 102. Via opening 106 is analogous to to the opening provided through mask 62 FIG. 5C. In polysilicon 2 doping ions are blanket implanted into DRAM devices. Polysilicon 2 layer 111 is analogous to layer 56 in FIG. 5E. The Via opening 86 is analogous to the opening provided by resist 62 in FIG. 5C.

Referring to FIGS. 1–4, 5A–5H, 6A–6D and 7, it should be noted that the polysilicon 1 layer and the polysilicon 2 layer can instead be substituted for a polycide. The equivalent of the polysilicon 1 layer 15, 25, 55, 85, and 105 can be composed of a polycide (refractory metal silicide) selected from the group consisting of $WSi_2$, $TiSi_2$, $CoSi_2$, and $MoSi_2$. The equivalent of the polysilicon 2 layer 26, 56, 96, and 111 can be composed of a polycide (refractory metal silicide) selected from the group consisting of $WSi_2$, $TiSi_2$, $CoSi_2$, $MoSi_2$ and $TaSi_2$.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A semiconductor electrostatic discharge device adapted for inclusion in a semiconductor memory system, formed on a semiconductor substrate covered with silicon dioxide and field oxide regions, comprising a first layer composed of a material selected from polysilicon and polycide having a surface, said surface of said device including thereon silicon dioxide and field oxide regions, said first layer having been patterned into a first gate in a first area and a second gate in a standard device area, said first area and said second area separated by a field oxide region, lightly doped implantation regions in said substrate adjacent to said gate in said standard device area, spacers adjacent to said periphery of said said second gate, dopant adjacent to said spacers forming source/drain regions adjacent to second gate, an interpolysilicon region over said standard device area, a second layer composed of a material selected from polysilicon and polycide formed upon said first area and said second layer stacked upon said first layer of said first gate, and second source/drain regions in said substrate adjacent to said first gate being doped.

2. A semiconductor device in accordance with claim 1 wherein said second gate structure is directly short circuited to said first gate layer of said electrostatic device area of said device.

3. A semiconductor device in accordance with claim 1 wherein said second layer was doped with about $2\times10^{15}$ ions/cm$^2$.

4. A method of manufacture of a semiconductor electrostatic discharge protection device adapted for inclusion in a semiconductor memory system, formed on a semiconductor substrate covered with silicon dioxide regions and field oxide regions between said silicon dioxide regions, comprising formation of a blanket first gate element layer on said surface of said device including said silicon dioxide and field oxide regions, patterning said first gate layer into a first gate element without spacers for a first device overlying portions of said field oxide regions and a second gate element with spacers in a standard device area said first gate element and said second gate element separated by field oxide regions, formation of lightly doped drain implantation into said substrate adjacent to said second gate element in said standard device area, formation of spacers adjacent to said periphery of said first gate element and said second gate element, ion implanting dopant adjacent to said spacers to form source/drain regions adjacent to said second gate of said standard device, formation of an interpolysilicon dielectric layer over said device, formation of a polysilicon via mask over said standard device area and etching away said interpolysilicon dielectric layer over said first gate element to form a via opening through areas unprotected by said mask, deposition of a blanket second gate layer shorted to said first gate element and forming a masking layer and etching away exposed areas of said second gate layer and said first gate element leaving a stacked structure from portions of said first gate element and said second gate layer, removal of said masking layer, and formation of a mask and performing a doping process doping said second layer and second source/drain regions in said substrate adjacent to said first gate, whereby Lightly Doped Drain (LDD) technology includes Input/Output Electrostatic Discharge (ESD) protection without the burden of providing one extra masking step to secure the desired protection.

5. A method in accordance with claim 4 wherein said second gate layer is directly short circuited to said first gate element.

6. A method in accordance with claim 4 wherein said first gate element layer comprises a material selected from polysilicon and a polycide selected from the group consisting of $WSi_2$, $TiSi_2$, $CoSi_2$, and $MoSi_2$, said second gate layer comprises a material selected from polysilicon and a polycide selected from the group consisting of $WSi_2$, $TiSi_2$, $CoSi_2$, $MoSi_2$, and $TaSi_2$; and a doping process for doping near said first gate element was doped with between about $1\times10^{15}$ ions/cm$^2$ and about $5\times10^{15}$ ions/cm$^2$.

7. A method in accordance with claim 4 wherein said interpolysilicon region over said standard device area has a thickness of about 2000 Å.

8. A method in accordance with claim 4 wherein said second source/drain regions in said substrate in said first gate element area was doped with about $2\times10^{15}$ ions/cm$^2$.

9. A method in accordance with claim 5 wherein said first gate element layer comprises a material selected from polysilicon and a polycide selected from the group consisting of $WSi_2$, $TiSi_2$, $CoSi_2$, and $MoSi_2$, said second layer comprises a material selected from polysilicon and a polycide selected from the group consisting of $WSi_2$, $TiSi_2$, $CoSi_2$, $MoSi_2$, and $TaSi_2$; and a doping process for said lightly doped doping near said second gate element was doped at about $2\times10^{13}$ ions/cm$^2$ of $p^{31}$ at an energy of about 60 keV, said source/drain doping for said second gate element was doped at about $5\times10^{15}$ ions/cm$^2$ of $As^+$ at an energy of about 80 keV, and said source/drain doping for said first gate element was doped at about $2\times10^{15}$ ions/cm$^2$ of As$^+$ at an energy of about 80 keV.

10. A method in accordance with claim 5 wherein said interpolysilicon region over said standard device area has a thickness of about 2000 Å.

11. A method in accordance with claim 5 wherein said second source/drain regions in said substrate in said first gate element area were doped at between about $1\times10^{15}$ ions/cm$^2$ and about $5\times10^{15}$ ions/cm$^2$ at an energy between about 40 keV and about 120 keV, said lightly doped regions in the area adjacent to said second gate element area were doped at between about $5\times10^{12}$ ions/cm$^2$ and about $5\times10^{13}$ ions/cm$^2$ at an energy between about 30 keV and about 90 keV, and said source/drain regions in the area about second gate element area were doped at between about $1\times10^{15}$ ions/cm$^2$ and about $8\times10^{15}$ ions/cm$^2$ at an energy between about 40 keV and about 120 keV.

12. A method in accordance with claim 6 wherein said interpolysilicon region over said standard device area has a thickness of about 2000 Å.

13. A method in accordance with claim 6 wherein said second source/drain regions in said substrate in said first gate element area were doped at about $2\times10^{15}$ ions/cm$^2$ at an energy of about 80 keV.

* * * * *